US008885785B2

(12) United States Patent
Zhang et al.

(10) Patent No.: US 8,885,785 B2
(45) Date of Patent: Nov. 11, 2014

(54) CDR CIRCUIT AND TERMINAL

(71) Applicant: Huawei Technologies Co., Ltd., Guangdong (CN)

(72) Inventors: Xuekun Zhang, Chengdu (CN); Jindi Zhang, Shenzhen (CN); Bo Yu, Chengdu (CN); Faji Yin, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/013,895

(22) Filed: Aug. 29, 2013

(65) Prior Publication Data

US 2014/0064422 A1 Mar. 6, 2014

(30) Foreign Application Priority Data

Aug. 31, 2012 (CN) .......................... 2012 1 0318905

(51) Int. Cl.
*H04L 7/00* (2006.01)
*H04L 7/02* (2006.01)

(52) U.S. Cl.
CPC ............... *H04L 7/02* (2013.01); *H04L 7/0083* (2013.01)
USPC ....................................................... 375/371

(58) Field of Classification Search
CPC ....... H04L 7/0083; H04L 7/02; H04L 7/0087; H04L 7/0332
USPC ............. 375/371, 293, 355; 702/69; 713/400, 713/503
See application file for complete search history.

(56) References Cited

U.S. PATENT DOCUMENTS 6,400,683 B1 * 6/2002 Jay et al. .................. 370/229
6,531,926 B1 * 3/2003 Pate et al. .................. 331/17
(Continued)

FOREIGN PATENT DOCUMENTS

CN 102271231 A 12/2011

OTHER PUBLICATIONS

Litwin, L., "Using PLLs to Obtain Carrier Synchronization: Part 1", Thomson Multimedia, Mar. 25, 2003 as appeared on http://www.eetimes.com/documentasp?doc_id=1277058.*

(Continued)

*Primary Examiner* — Daniel Washburn
*Assistant Examiner* — Amneet Singh
(74) *Attorney, Agent, or Firm* — Leydig, Voit & Mayer, Ltd.

(57) ABSTRACT

Embodiments of the present invention disclose a CDR circuit and a terminal, where the CDR circuit is configured to perform clock synchronization in a terminal with EEE function, and the CDR circuit includes: a phase detector, a first phase signal selector, a loop filter, a numerical controlled oscillator, a second phase signal selector, a phase signal generator, and a state machine. In the embodiments of the present invention, after the terminal enters a REFRESH state from a QUIET state, the CDR circuit can implement clock synchronization with a peer end without waiting for the loop filter and the numerical controlled oscillator to be converged, but the phase signal generator generates a phase signal satisfying a preset clock synchronization condition, and the second phase signal selector selects the phase signal satisfying the preset clock synchronization condition as the phase selection signal of the CDR.

20 Claims, 2 Drawing Sheets

(56) References Cited

U.S. PATENT DOCUMENTS

| | | | | |
|---|---|---|---|---|
| 6,977,975 | B1* | 12/2005 | Reuveni | 375/340 |
| 7,254,169 | B1* | 8/2007 | Steiner et al. | 375/227 |
| 7,295,644 | B1* | 11/2007 | Wu et al. | 375/375 |
| 7,409,031 | B1* | 8/2008 | Lee et al. | 375/376 |
| 7,684,532 | B2* | 3/2010 | Aung et al. | 375/355 |
| 7,945,404 | B2* | 5/2011 | Ho et al. | 702/69 |
| 8,649,473 | B2* | 2/2014 | Nishi et al. | 375/354 |
| 2005/0218999 | A1* | 10/2005 | Jasa et al. | 331/16 |
| 2006/0198482 | A1* | 9/2006 | Meltzer et al. | 375/376 |
| 2007/0047683 | A1* | 3/2007 | Okamura et al. | 375/355 |
| 2007/0139159 | A1* | 6/2007 | Mittal et al. | 340/10.1 |
| 2007/0141983 | A1* | 6/2007 | Shyu et al. | 455/41.1 |
| 2009/0231001 | A1* | 9/2009 | Fukuda et al. | 327/144 |
| 2009/0271133 | A1* | 10/2009 | Ho et al. | 702/69 |
| 2010/0046543 | A1 | 2/2010 | Parnaby | |
| 2011/0001531 | A1* | 1/2011 | Nishi et al. | 327/162 |
| 2012/0191998 | A1 | 7/2012 | Tazebay et al. | |
| 2013/0294492 | A1* | 11/2013 | Miao | 375/232 |
| 2013/0346663 | A1* | 12/2013 | Tell | 710/305 |

OTHER PUBLICATIONS

Zeng et al., "Design and implementation of a rapid synchronous clock and data recovery circuit," State Key Laboratory on Microwave and Digital Communication, Department of Electronic Engineering, Tsinghua University, Beijing, China (Jan. 2007).

* cited by examiner

CDR CIRCUIT AND TERMINAL

CROSS-REFERENCE TO RELATED APPLICATIONS

This application claims priority to Chinese Patent Application No. 201210318905.4, filed on Aug. 31, 2012, which is hereby incorporated by reference in its entirety.

TECHNICAL FIELD

The present invention relates to the field of network communications technologies, and in particular, to a CDR (Clock Data Recovery, clock data recovery) circuit and a terminal.

BACKGROUND

When terminal devices such as a PC (Personal Computer, personal computer) and a common server are used for accessing a network, for example, browsing a web page, network traffic is usually increased rapidly at the instant that the website is clicked, and the traffic is reduced after the web page is loaded. During the browsing process, generally the network traffic is not required. For the pulse type changing feature of the network traffic, the EEE (Energy Efficient Ethernet, energy efficient Ethernet) standard is proposed in the prior art so that dynamic energy-saving is implemented according to the feature of the network traffic. The network traffic is usually transmitted based on the Internet layer, where physical signal conversion is performed on a PHY layer, and when no data is transmitted on a MAC (Media Access Control, media access control) layer, training data is transmitted as little as possible on the PHY layer, or no training data is transmitted, to achieve the object of energy saving.

When no data is transmitted on the MAC layer, and an IDLE (idle) signal is transmitted on the PHY layer, the network is in ACTIVE (active) mode. In this case, the MAC layer transmits an LPI (Low Power Idle, low power mode) request signal. The PHY layer enters a QUIET (quiet) state after receiving the signal. In the QUIET state, no signal is transmitted over the link, thereby achieving energy saving. However, in order to keep synchronization performance with a communication peer end when the ACTIVE state is entered, a REFRESH (REFRESH) state needs to be periodically inserted into the QUIET state, so that the terminal is capable of keeping synchronization performance with the communication peer end according to the training signal from the communication peer end.

In the prior art, in the REFRESH state, the terminal is required to implement clock synchronization within a preset time of period (usually 16.5 microseconds) by using a built-in CDR circuit. In the clock synchronization process, an input phase signal of a loop filter in the CDR circuit is controlled by using two state signals, so that the clock synchronization is implemented after phase convergence. However, in the prior art, after the terminal receives the refresh signal from the peer end, if frequency deviation between two communication parties is large, the phase convergence process is controlled by using two state signals, which results in a slow convergence speed. Therefore, the terminal can hardly implement clock synchronization with the peer end within the preset time of period, and thus the terminal cannot receive data from the communication peer end when entering the ACTIVE mode.

SUMMARY

Embodiments of the present invention provide a CDR circuit and a terminal, to solve the problem in the prior art that the CDR circuit in the terminal can hardly implement clock synchronization with the peer end within a preset time of period.

In order to solve the technical problems, the embodiments of the present invention disclose the following technical solutions:

In one aspect, a CDR circuit is provided. The CDR circuit is configured to perform clock synchronization in a terminal with EEE function, and the CDR circuit includes: a phase detector, a first phase signal selector, a loop filter, a numerical controlled oscillator, a second phase signal selector, a phase signal generator, and a state machine.

The state machine is configured to generate a second state signal after receiving a signal indicating that the terminal has entered a REFRESH state from a QUIET state, and input the second state signal into the first phase signal selector, the phase signal generator, and the second phase signal selector.

The phase detector is configured to acquire a phase error between the terminal and a peer end from training data sent by the peer end, and input the phase error into the first phase signal selector.

The first phase signal selector is configured to select, according to the indication of the second state signal, a previously input phase signal 0 from the previously input phase signal 0 and the phase error input by the phase detector, and input the previously input phase signal 0 into the loop filter.

The loop filter is configured to output, according to the previously input phase signal 0, the phase error saved in the first register module to the numerical controlled oscillator.

The numerical controlled oscillator is configured to accumulate the phase error saved in the first register module and the phase error saved in the second register module of the numerical controlled oscillator, and input an accumulated value of the phase errors into the second phase signal selector.

The phase signal generator is configured to generate, according to the indication of the second state signal and an initial phase signal saved in the phase signal generator, a phase signal satisfying a preset clock synchronization condition, and input the phase signal into the second phase signal selector.

The second phase signal selector is configured to select, according to the indication of the second state signal, the phase signal satisfying the preset clock synchronization condition and input by the phase signal generator as a phase selection signal of the CDR circuit, where the phase selection signal is used to enable the terminal to implement clock synchronization with the peer end according to the phase selection signal.

In another aspect, a terminal including the CDR circuit is provided. The terminal further includes: a control module, configured to: after the CDR circuit implements clock synchronization between the terminal and a peer end, and if the terminal has data to be transmitted, control the terminal to enter an ACTIVE mode; otherwise, control the terminal to enter a QUIET state after a REFRESH state is over.

In the embodiments of the present invention, when a terminal enters a REFRESH state from a QUIET state in low power operating mode, a state machine in a CDR circuit generates a second state signal, and inputs the second state signal into a first phase signal selector, a phase signal generator, and a second phase signal selector; a phase detector acquires a phase error between the terminal and a peer end from training data sent by the peer end, and inputs the phase error into the first phase signal selector; the first phase signal selector selects, according to the indication of the second state signal, a previously input phase signal 0 from the previously input phase signal 0 and the phase error input by the phase detector, and inputs the previously input phase signal 0 into a loop filter; the loop filter outputs the phase error saved in the first register module to a numerical controlled oscillator according to the previously input phase signal 0; the numerical controlled oscillator accumulates the phase error saved in the first register module and the phase error saved in the second register module of the numerical controlled oscillator, and inputs the accumulated value of the phase errors into the second phase signal selector; the phase signal generator generates, according to the indication of the second state signal and an initial phase signal saved in the phase signal generator, a phase signal satisfying a preset clock synchronization condition, and inputs the phase signal into the second phase signal selector; and the second phase signal selector selects, according to the indication of the second state signal, the phase signal satisfying the preset clock synchronization condition and input by the phase signal generator as a phase selection signal of the CDR circuit, and the terminal implements clock synchronization with the peer end according to the phase selection signal. In the embodiments of the present invention, after the terminal enters the REFRESH state from the QUIET state, the CDR circuit can implement clock synchronization with a peer end without waiting for the loop filter and the numerical controlled oscillator to be converged, but the phase signal generator generates a phase signal satisfying a preset clock synchronization condition, and the second phase signal selector selects the phase signal satisfying the preset clock synchronization condition as the phase selection signal of the CDR, so as to implement synchronization with the peer end rapidly, so that terminal receives data from the peer end when entering the ACTIVE mode, thereby ensuring that the terminal implements an EEE function.

BRIEF DESCRIPTION OF DRAWINGS

To describe the technical solutions in the embodiments of the present invention or in the prior art more clearly, the following briefly introduces the accompanying drawings for describing the embodiments or the prior art. Apparently, the accompanying drawings in the following description are merely some embodiments of the present application, and persons of ordinary skill in the art may still derive other drawings from the accompanying drawings without creative efforts.

DESCRIPTION OF EMBODIMENTS

The following embodiments of the present invention provide a CDR circuit and a terminal, to implement an EEE function of a terminal.

To help persons skilled in the art better understand the technical solutions in the embodiments of the present invention, and make the objectives, features, and advantages of the embodiments of the present invention clearer and more comprehensible, the technical solutions in the embodiments of the present invention are described in further detail with reference to the accompanying drawings.

Figure 1:
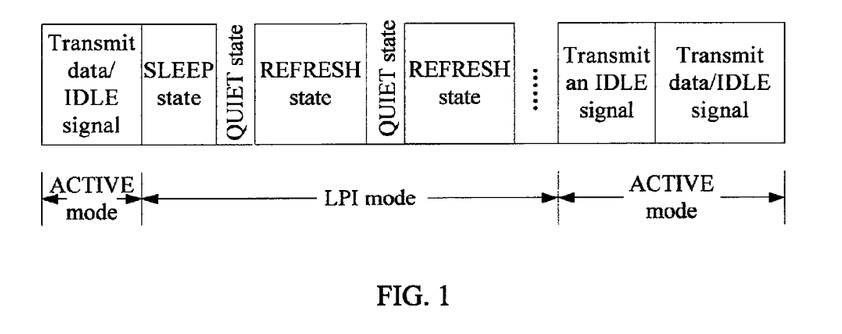
FIG. 1 is a schematic diagram of a working state in a terminal according to an embodiment of the present invention.

The embodiments of the present invention are applied to EEE, and the EEE standard is used to perform dynamic energy-saving according to the feature of network traffic. Referring to FIG. 1, a schematic diagram of a working state in a terminal for implementing an EEE function according to an embodiment of the present invention is illustrated.

In FIG. 1, in an active ACTIVE mode, a MAC layer in the terminal has no data to be transmitted, and a PHY layer transmits an IDLE signal. In this case, the MAC layer transmits an LPI request to the PHY layer, and the PHY enters an LPI mode according to the LPI request, where the PHY first enters a SLEEP state, and enters a QUIET state from the SLEEP state, and a REFRESH state is periodically inserted into the QUIET state, so that through the training data received in the REFRESH state (which is also called a REFRESH signal) and sent by a peer end, synchronization performance is kept with the peer end. Therefore, when the PHY layer exits the Quiet state, the ACTIVE mode may be entered as soon as possible, so that normal data transmission with the peer end is performed, and data loss is avoided.

In the embodiment of the present invention, two ends of a communication link, that is, a terminal and a peer end of the terminal, may determine, by using an adaptive negotiation mechanism, that one party of the two parities performing data transmission is a master (Master), and the other is a slave (Slave). After the Master and the slave establish communication connection, normal data transmission is performed in the Active state, and when any one of the Master and the Slave has no data to be transmitted, the PHY layers of the Master and the Slave request entering the Quiet (QUIET) state. In this case, no data is transmitted over the communication link. In order to ensure that in the Quiet state, the communication link can recover to a normal state when there is data to be transmitted, the Master and the slave need to transmit the training data according to a certain period, so that clock synchronization may be performed between the Master and the slave, and normal data transmission over the communication link is ensured. According to the regulation of the EEE standard, the period of the Quiet state is 20 to 24 milliseconds, the period of the Refresh state is 16.5 microseconds, that is, a communication terminal is required to complete adaptive clock synchronization with a communication peer end within the Refresh state of 16.5 microseconds after the Quiet state of 20 to 24 milliseconds is over, so that the communication link can be recovered, as soon as possible, to an Active state where data is normally transmitted. After the Refresh state is over, if there is data to be transmitted in the MAC layer of the communication terminal, the communication terminal enters the Active state; otherwise, the communication terminal continues to enter the Quiet state.

Figure 2:
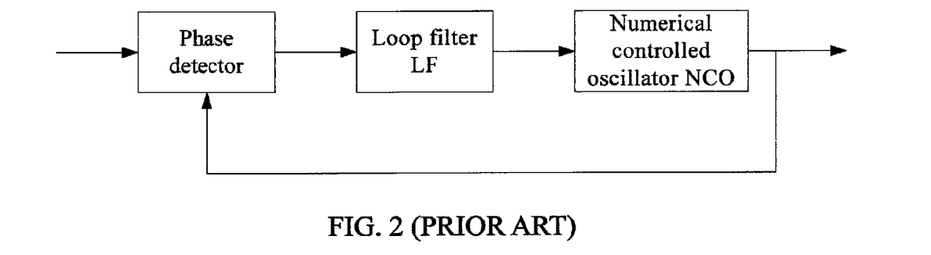
FIG. 2 is a general schematic structural diagram of a CDR circuit in a terminal.

With a clock synchronization method, a CDR circuit and a terminal provided in the embodiments of the present invention, after the Quiet state of a terminal in a PHY layer is over, the PHY layer is enabled to recover, as soon as possible, to an available state within the specified duration in the Refresh state, to keep clock synchronization with a communication peer end. Generically, a communication terminal implements clock synchronization by using the CDR circuit. Referring to FIG. 2, a general schematic structural diagram of a CDR circuit in a terminal is illustrated.

The CDR circuit usually includes a phase detector, an LF (loop filter, Loop Filter) and an NCO (numerical controlled oscillator, Numerical Controlled Oscillator). The phase detector extracts a transmit clock from data transmitted by a peer communication device, detects a phase error between the transmit clock and a local clock, and inputs the phase error into the LF. The LF filters a high frequency part of the phase error, extracts clock information of a low frequency part from the phase error, and transmits the clock information to the NCO. After the CDR circuit implements overall clock synchronization convergence, the LF saves a momentary value of a phase error between clocks of two communication parties. The NCO adjusts, according to the phase error transmitted by the LF, a phase point for sampling local received data, to achieve accurate data receiving, and complete a phase locking function.

Figure 3:
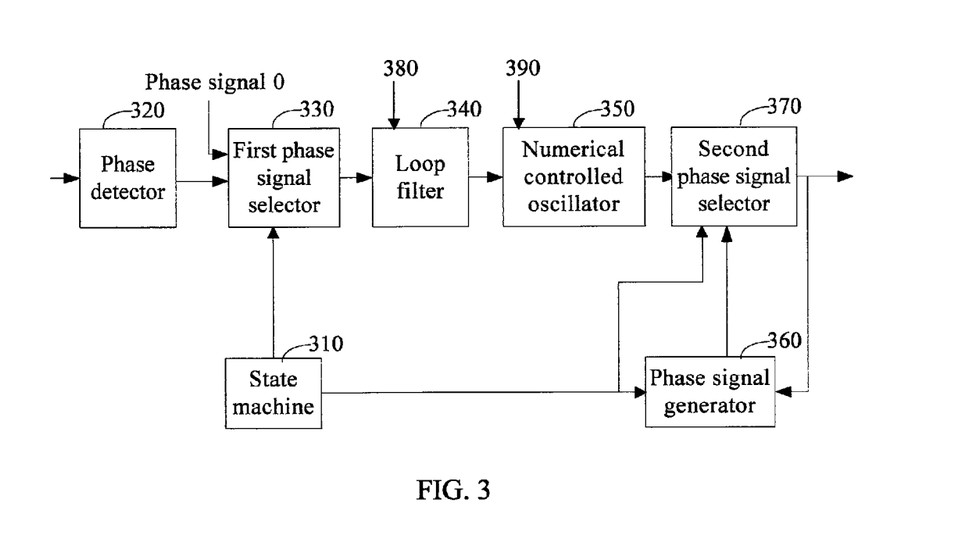
FIG. 3 is a block diagram of an embodiment of a CDR circuit according to the present invention.

Based a general structure shown in FIG. 2, a state machine, a phase signal generator, and a phase signal selector are mainly added for the CDR circuit in the embodiment of the present invention. Referring to FIG. 3, a block diagram of an embodiment of a CDR circuit according to the present invention is illustrated.

The CDR circuit includes: a state machine 310, a phase detector 320, a first phase signal selector 330, a loop filter 340, a numerical controlled oscillator 350, a phase signal generator 360, and a second phase signal selector 370.

When the CDR circuit enters an LPI working mode, a clock synchronization process is divided into four stages. A first stage is a working process of the CDR circuit when the terminal is in a QUIET state, a second stage is a process that the terminal enters a REFRESH state from the QUIET state, generates, through the phase signal generator, a phase signal satisfying a clock synchronization condition, to quickly implement synchronization between the terminal and a peer end, a third stage is a process that convergence is performed for the loop filter, to implement normal working of the CDR circuit, and a fourth stage is a process that the terminal performs normal data transmission with the peer end through the CDR circuit. The working process of the CDR circuit is described in detail with reference to the four processes.

The first stage is the working process of the CDR circuit when the terminal is in the QUIET state.

The state machine 310 is configured to generate a first state signal after receiving a signal indicating that the terminal has entered the REFRESH state, and input the first state signal into the first phase signal selector 330, the phase signal generator 360, and the second phase signal selector 370 in parallel.

The phase detector 320 is configured to receive invalid data, and input an invalid phase signal, which is generated according to the invalid data, to the first phase signal selector 330. When the phase detector 320 is in ACTIVE mode and in the REFRESH state, it may use the data transmitted by the peer end as the input of the phase detector, extracts a transmit clock of the peer end from the data, detects a phase error between the transmit clock and a local clock, and uses the phase error as output of the phase detector. However, in the QUIET state, the peer end has no data to be transmitted, so the data input into the phase detector is invalid data, and the phase error obtained according to the invalid data is an invalid phase error. Therefore, the phase detector outputs an invalid phase signal.

The first phase signal selector 330 is further configured to select, according to the indication of the first state signal input by the state machine 310, a previously input phase signal 0 from the previously input phase signal 0 and the invalid phase signal input by the phase detector 320, and input the selected phase signal 0 into the loop filter 340.

The loop filter 340 is configured to directly output, according to the previously input phase signal 0 output by the first phase selector 330, the phase error saved in a first register module 380 to the numerical controlled oscillator 350, where the phase error saved in the first register module 380 is a phase error between the terminal in the ACTIVE mode and the peer end before the terminal enters the QUIET state.

The numerical controlled oscillator 350 is configured to accumulate the received phase error saved in the first register module 380 and the phase error saved in a second register module 390, and input an accumulated value of the phase errors into the second phase signal selector 370.

The phase signal generator 360 is configured to input the preset phase signal into the second phase signal selector 370 according to the indication of the first state signal generated by the state machine 310.

The second phase signal selector 370 is configured to select, according to the indication of the first state signal generated by the state machine 310, the accumulated value of the phase errors input by the numerical controlled oscillator 350 from the accumulated value of the phase errors input by the numerical controlled oscillator 350 and the preset phase signal input by the phase signal generator 360 as the phase selection signal of the CDR circuit, and input the phase selection signal into the phase signal generator 360, to be used as an initial phase signal of the phase signal generator 360 at the second stage.

In the second stage, when the terminal enters the REFRESH state from the QUIET state, the terminal quickly obtains a phase error of synchronization between the terminal and the peer end through the phase signal selector, to complete coarse tuning of the CDR circuit.

The state machine 310 is configured to generate a second state signal after receiving a signal indicating that the terminal has entered the REFRESH state from the QUIET state, and input the second state signal into the first phase signal selector 330, the phase signal generator 360, and the second phase signal selector 370 in parallel.

The phase detector 320 is configured to receive training data transmitted by the peer end, extract a transmit clock of the peer end from the training data, detect a phase error between the transmit clock and a local clock, and input the phase error into the first phase signal selector 330.

The first phase signal selector 330 is configured to select, according to the indication of the second state signal input by the state machine 320, a previously input phase signal 0 from the input phase signal 0 and the phase error output by the phase detector 320, and input the selected phase signal 0 into the loop filter 340. In this case, the terminal just enters the REFRESH state, and clock synchronization between the terminal and the peer end is not implemented. Therefore, the first phase signal selector 330 still selects the phase signal 0 as output of the first phase signal selector 330.

The loop filter 340 is configured to directly output the phase error saved in a first register module 380 to the numerical controlled oscillator 350 according to the previously input phase signal 0 output by the first phase selector 330, where the phase error is consistent with the phase error saved in the first register module 380 when the terminal is in the QUIET state.

The numerical controlled oscillator 350 is configured to accumulate the received phase error saved in the first register module 380 and the phase error saved in a second register module 390, and input the accumulated value of the phase errors into the second phase signal selector 370.

The phase signal generator 360 is configured to generate, according to the indication of the second state signal generated by the state machine 310 and according to the initial phase signal saved in the phase signal generator, a phase signal satisfying a preset clock synchronization condition, and input the phase signal into the second phase signal selector 370. Specifically, when generating the phase signal satisfying the preset clock synchronization condition, starting from the initial phase signal, the phase signal generator 360 uses the initial phase signal as the phase signal generated by the phase signal generator 360, determines whether the signal-to-noise ratio value of the terminal is smaller than a preset threshold, if the signal-to-noise ratio value is smaller than the preset threshold, determines that the initial phase signal satisfies the preset clock synchronization condition; if the signal-to-noise ratio value is not smaller than the preset threshold, add a preset step value to an initial phase signal to produce the phase signal generated by the phase signal generator 360, repeatedly performs the step of determining whether the signal-to-noise ratio value of the terminal is smaller than the preset threshold, until the phase signal generator 360 generates a phase signal satisfying the preset clock synchronization condition, and inputs the phase signal satisfying the preset clock synchronization condition into the second phase signal selector 370.

The second phase signal selector 370 is configured to: select, according to the second state signal generated by the state machine 310, the phase signal input by the phase signal generator 360 from the accumulated value of the phase errors which is input by the numerical controlled oscillator 350 and the phase signal satisfying the preset clock synchronization condition and input by the phase signal generator 360, as the phase selection signal of the CDR circuit, and input the phase selection signal into the phase signal generator 360, to be used as a phase signal generated by the phase signal generator 360 in the third stage, where the phase selection signal is the phase signal satisfying the preset clock synchronization condition.

After the second stage is over, the phase selection signal output by the second phase signal selector 370 satisfies the preset clock synchronization condition, that is, the signal-to-noise ratio value of the terminal is smaller than the preset threshold. Therefore, clock synchronization between the terminal and the peer end is achieved. However, the loop filter and the numerical controlled oscillator have not implemented adaptive convergence according to the received training data. Therefore, the third stage and the fourth stage need to be further performed subsequently until the CDR circuit is entirely converged.

In the third stage, after terminal implements coarse tuning of the CDR circuit, it performs convergence through the loop filter, to implement fine tuning of the CDR circuit.

The state machine 310 is configured to generate a third state signal when receiving a signal indicating to the phase signal generator generating the phase signal satisfying the preset clock synchronization condition, and input the third state signal into the first phase signal selector 330, the phase signal generator 360, and the second phase signal selector 370 in parallel.

The phase detector 320 is configured to receive the training data transmitted by the peer end, extract a transmit clock of the peer end from the training data, detect a phase error between the transmit clock and a local clock, and use the phase error as the output of the phase detector 320.

The first phase signal selector 330 is configured to select, according to the third state signal input by the state machine 320, the phase error output by the phase detector 320 from an input phase signal 0 and the phase error output by the phase detector 320, and input the phase error into the loop filter 340. In this case, the terminal has adjusted the phase error in the second stage. Therefore, the first phase signal selector 330 selects the phase error output by the phase detector 320 as the output of the first phase signal selector 330.

The loop filter 340 is configured to accumulate, within a preset convergence duration, the phase error output by the first phase signal selector 330 and the phase error saved in a first register module 380, where the first register module 380 saves the accumulated value of the phase errors, and inputs the accumulated value of the phase errors into the numerical controlled oscillator 350.

The numerical controlled oscillator 350 is configured to accumulate the phase error input by the loop filter 340 and the phase error saved in a second register module 390, and input the accumulated value of the phase errors into the second phase signal selector 370.

The phase signal generator 360 is configured to use, according to the indication of the third state signal generated by the state machine 310, the phase selection signal selected according to the indication of the second state signal, as the phase signal generated by the phase signal generator 360, and input the phase signal into the second phase signal selector 370.

The second phase signal selector 370 is configured to select, according to the indication of the third state signal generated by the state machine 310, the phase error input by the phase signal generator 360 from the accumulated value of the phase errors which is input by the numerical controlled oscillator 350 and the phase signal input by the phase signal generator 360, as the phase selection signal of the CDR circuit, and input the phase selection signal into the phase signal generator 360, to be used as a phase signal generated by the phase signal generator 360 in the fourth stage, where the phase selection signal is the phase signal satisfying the preset clock synchronization condition.

In the fourth stage: after the CDR circuit implements fine tuning, normal data transmission is performed between the terminal and the peer end.

The state machine 310 is configured to generate a fourth state signal after receiving a signal indicating that the convergence duration of the loop filter 340 expires, and input the fourth state signal into the first phase signal selector 330, the phase signal generator 360, and the second phase signal selector 370 in parallel.

The phase detector 320 is configured to receive the training data transmitted by the peer end, extract a transmit clock of the peer end from the training data, detect a phase error between the transmit clock and a local clock, and use the phase error as the output of the phase detector 320.

The first phase signal selector 330 is configured to select, according to the indication of the fourth state signal input by the state machine 320, the phase error output by the phase detector 320 from an input phase signal 0 and the phase error output by the phase detector 320, and output the selected phase error to the loop filter 340.

The loop filter 340 is configured to accumulate the phase error output by the first phase signal selector 330 and the phase error saved in a first register module 380, where the first register module 380 saves the accumulated value of the phase errors, and outputs the accumulated value of the phase errors to the numerical controlled oscillator 350.

The numerical controlled oscillator 350 is configured to adjust a phase point for sampling local received data according to the phase error output by the loop filter 340, accumulate the phase error output by the loop filter 340 and the phase error saved in a second register module 390, and input the accumulated value of the phase errors into the second phase signal selector 370.

The phase signal generator 360 is configured to use, according to the indication of the fourth state signal generated by the state machine 310, the phase selection signal selected according to the indication of the third state signal as the phase signal generated by the phase signal generator 360, and input the phase signal into the second phase signal selector 370.

The second phase signal selector 370 is configured to select, according to the indication of the fourth state signal generated by the state machine 310, the phase error input by the numerical controlled oscillator 350 from the accumulated value of the phase errors input by the numerical controlled oscillator 350 and the phase signal input by the phase signal generator 360 as the phase selection signal of the CDR circuit, and input the phase selection signal into the phase signal generator 360, to be used as a preset phase signal of the phase signal generator 360 when the terminal enters the Quiet state again.

It can be seen from the above embodiment that, after the terminal enters the REFRESH state from the QUIET state, the CDR circuit can implement clock synchronization with a peer end without waiting for the loop filter and the numerical controlled oscillator to be converged, but the phase signal generator generates a phase signal satisfying a preset clock synchronization condition, and the second phase signal selector selects the phase signal satisfying the preset clock synchronization condition as the phase selection signal of the CDR, so as to implement synchronization with the peer end rapidly, so that terminal may receive data from the peer end when entering the ACTIVE mode, thereby ensuring that the terminal can implement an EEE function. In addition, after the terminal generates, through the phase signal generator of the CDR circuit, the phase signal satisfying the preset clock synchronization condition, convergence is performed for the loop filter, so that the CDR circuit enters the ACTIVE state, thereby ensuring that the terminal performs normal data transmission with the peer end through the CDR circuit.

Corresponding to the embodiment of the CDR circuit of the present invention, the present invention further provides an embodiment of a terminal including the CDR circuit shown in the embodiment.

Figure 4:
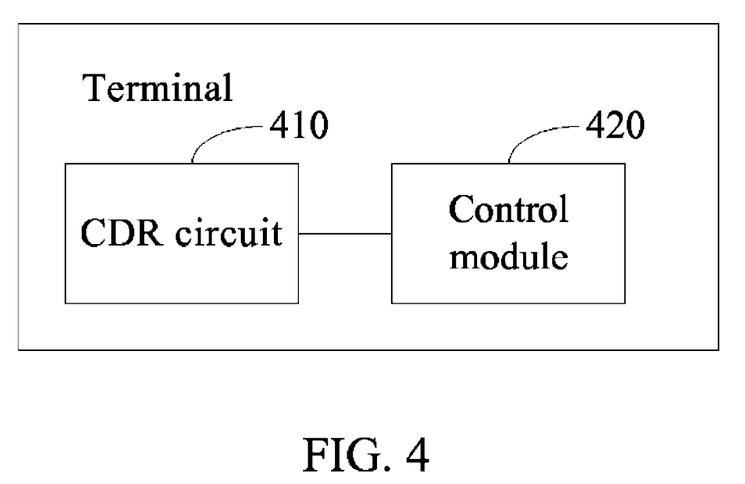
FIG. 4 is a block diagram of an embodiment of a terminal according to the present invention.

Referring to FIG. 4, a block diagram of an embodiment of a terminal according to the present invention is illustrated.

The terminal includes: a CDR circuit 410 and a control module 420. It should be noted that, for ease of illustration, the terminal according to the embodiment of the present invention only shows the part related to clock synchronization.

The process that the CDR circuit 410 implements clock synchronization is the same as the embodiment shown in FIG. 3, which is not repeated herein any longer. The control module 420 is configured to, when the CDR circuit 410 implements clock synchronization between the terminal and a peer end, if the terminal has data to be transmitted, control the terminal to enter an ACTIVE mode; otherwise, control the terminal to enter a QUIET state after a REFRESH state is over.

Considering from the perspective of data transmission, the terminal in the embodiment of the present invention includes two parts, namely, a transmitter and a receiver. The CDR circuit 410 and the control module 420 are set in the receiver, and are configured to, through received training data, implement clock synchronization with data transmitted by a transmitter of a peer end.

It can be seen from the above embodiment that, after the terminal enters the REFRESH state from the QUIET state, the CDR circuit can implement clock synchronization with a peer end without waiting for a loop filter and a numerical controlled oscillator to be converged, but a phase signal generator generates a phase signal satisfying a preset clock synchronization condition, and a second phase signal selector selects the phase signal satisfying the preset clock synchronization condition as the phase selection signal of the CDR, so as to implement synchronization with the peer end rapidly, so that the terminal may receive data from the peer end when entering an ACTIVE mode, thereby ensuring that the terminal implements an EEE function.

The process that the CDR circuit performs clock synchronization in the embodiment of the present invention is described by using an application example with reference to the structural diagram of the CDR circuit.

In the embodiment of the present invention, when the terminal enters a low power operating mode, the QUIET state and the REFRESH state emerge alternatively according to their respective periods. Therefore, an indication signal of a QUIET state and an indication signal of a REFRESH state can be generated according to the periods by setting a timer. In addition, a signal indicating that convergence of the CDR circuit is completed can be generated by setting a timer, so that the terminal enters different states according to the indication signals, respectively.

In this application example, it is assumed that the state signal generated by a state machine is represented as CDR_frz, and its values are 0, 1, 2, 3, a signal selected by a first phase signal selector is represented as ph_sel1, and a signal selected by a second phase signal selector is represented as ph_sel2.

When the terminal enters the QUIET state, the state machine receives a signal indicating that it enters the QUIET state, CDR_frz=0 is generated, and a state signal "0" is inputted into a first phase signal selector, a phase signal generator, and a second phase signal selector. In this case, the terminal is in the QUIET state, a peer end has no data to be transmitted, and what is received by a phase detector is invalid data. Therefore, a phase error between the clock extracted from the invalid data and a local clock is an invalid phase signal. The first phase signal selector selects, according to the state signal "0", the previously input phase signal 0 from the invalid phase signal input by the phase detector and the previously input phase signal 0 as ph_sel1 and inputs it into a loop filter. The phase error between the terminal in the ACTIVE mode and the peer end before the terminal enters the QUIET state is saved in a register module of the loop filter. Therefore, after the previously input phase signal 0 and the phase error are accumulated, the accumulated result is still the phase error, and the phase error is output to an NCO. The NCO accumulates the phase error and the phase error saved in the register module, and inputs the accumulated value of the phase errors into the second phase signal selector. At the same time, the phase signal generator inputs a preset phase signal into the second phase signal selector according to the state signal "0" generated by the state machine. The second phase signal selector selects, according to the state signal "0", the output of the NCO as the phase selection signal ph_sel2 of the CDR circuit, and returns ph_sel2 to the phase signal generator, to be used as the initial phase signal of the phase signal generator at a next stage. When CDR_frz=0, the foregoing process is repeated, until a signal that it enters the REFRESH state is received.

When a timer expires at the timing period of the QUIET state, the terminal enters the REFRESH state, and the state machine receives the signal indicating that it enters the REFRESH state, generates CDR_frz=1, and inputs a state signal "1" into the first phase signal selector, the phase signal generator, and the second phase signal selector. After it enters the REFRESH state, the phase detector receives the training data transmitted by the peer end, extracts a transmit clock of the peer end from the training data, detects a phase error between the transmit clock and a local clock, and uses the phase error as the output of the phase detector. The terminal just enters the REFRESH state, clock synchronization between the terminal and the peer end is not implemented. Therefore, the first phase signal selector selects, according to the state signal "1", the previously input phase signal 0 from the phase error input by the phase detector and the previously input phase signal 0, as ph_sel1, and inputs it into the loop filter. The loop filter accumulates the phase error saved in the register module and the previously input phase signal 0, and then still inputs the saved phase error into the NCO. The NCO accumulates the phase error and the phase error saved in the register module, and inputs the accumulated value of the phase errors into the second phase signal selector. At the same time, the phase signal generator performs automatic adjustment according to an initial value of the phase signal, to obtain a phase signal when the SNR value of the terminal is smaller than the preset threshold, and inputs the phase signal into the second phase signal selector, where the process of performing automatic adjustment according to the initial value of the phase signal is described as follows: in the embodiment of the present invention, a period of a data signal may be divided into 64 pieces, which is equivalent to that a piece of data has 64 phases. Initially, when CDR_frz=0 is switched to CDR_frz=1, the phase signal output by the NCO when CDR_frz=0 is used as the initial phase signal generated by the phase signal generator. In this case, it is determined whether the initial phase signal is an available phase signal according to the SNR value in the terminal. If the phase signal is available, the state machine generates CDR_frz=2; if the phase signal is unavailable, the phase signal generator controls the phase selection signal to add a step value to generate a next phase signal. Each data signal is divided into 64 phases. Therefore, the step value may be set as 1 or 4 according to a requirement, to ensure that an available phase signal may be selected after a phase period is cycled. For example, when the step value is selected to be 4, and in an extreme situation, adjustment needs to be performed 16 times after 64 phases are polled. After a next phase signal is generated, determining whether the phase signal is an available phase signal according to the SNR in the terminal is performed again, and the foregoing steps are repeated until the phase signal generated after a step value is added is an available phase signal. After the available phase signal is selected, the state machine generates CDR_frz=2. The second phase signal selector selects, according to the state signal "1", the output of the phase signal generator as the phase selection signal ph_sel2 of the CDR circuit, and returns ph_sel2 to the phase signal generator, to be used as the phase signal generated by the phase signal generator at the next stage.

When the state machine generates CDR_frz=2, a state signal "2" is input into the first phase signal selector, the phase signal generator, and the second phase signal selector. The phase detector receives the training data transmitted by the peer end, extracts the transmit clock of the peer end from the training data, detects a phase error between the transmit clock and a local clock, and uses the phase error as the output of the phase detector. The phase error between the terminal and the peer end is adjusted by using the phase signal generator, and synchronization between the terminal and the peer end is achieved. Therefore, the first phase signal selector selects the phase error, output by the phase detector, as ph_sel1 and outputs it to the loop filter. The loop filter accumulates the phase error output by the first signal selector and the phase error saved in the register module, outputs the accumulated value of the phase errors to the NCO. The NCO accumulates the phase error and the phase error saved in the register module, and inputs the accumulated value of the phase errors into the second phase signal selector. At the same time, the phase signal generator uses the phase signal, returned by the phase signal selector at a previous occasion, as the phase signal generated by the phase signal generator, inputs the phase signal into the second phase signal selector. The second phase signal selector selects, according to the state signal "2", the output of the phase signal generator as the phase selection signal ph_sel2 of the CDR circuit, and returns ph_sel2 to the phase signal generator, to be used as the phase signal generated by the phase signal generator at the next stage. When CDR_frz=2, the foregoing process is repeated until a preset convergence period expires.

When a timer expires at a preset convergence period, the state machine receives the signal indicating that convergence is completed, generates CDR_frz=3, inputs a state signal "3" into the first phase signal selector, the phase signal generator, and the second phase signal selector. The phase detector receives the training data transmitted by the peer end, extracts the transmit clock of the peer end from the training data, detects a phase error between the transmit clock and a local clock, and uses the phase error as the output of the phase detector. The first phase signal selector selects the phase error, output by the phase detector, as ph_sel1, and outputs ph_sel1 to the loop filter. The loop filter completes convergence when CDR_frz=2, and in this case, the loop filter accumulates the phase error output by the first signal selector and the phase error saved in the register module, and outputs the accumulated value of the phase errors to the NCO. The NCO may adjust a phase point for sampling local received data according to the phase error output by the loop filter, accumulates the phase error and the phase error saved in the register module, and inputs the accumulated value of the phase errors into the second phase signal selector. At the same time, the phase signal generator uses the phase signal, returned by the phase signal selector at a previous occasion, as the phase signal generated by the phase signal generator, inputs the phase signal into the second phase signal selector. The second phase signal selector selects, according to the state signal "3", the output of the NCO as the phase selection signal ph_sel2 of the CDR circuit, and returns ph_sel2 to the phase signal generator, to be used as the phase signal generated by the phase signal generator at the next stage. In this case, clock synchronization between the terminal and the peer end is implemented, and a transmission link is available. If the terminal has data to be transmitted in this case, the terminal enters the ACTIVE mode; otherwise, the terminal enters the QUIET state after the REFRESH state is over.

It can be seen from the above embodiment that, after the terminal enters the REFRESH state from the QUIET state in low power operating mode, the state machine of the CDR circuit generates the second state signal, and inputs the second state signal into the first phase signal selector, the phase signal generator, and the second phase signal selector. The phase detector acquires the phase error between the terminal and the peer end from the training data transmitted by the peer end and inputs it into the first phase signal selector. The first phase signal selector selects, according to the indication of the second state signal, a previously input phase signal 0 from the previously input phase signal 0 and the phase error input by the phase detector, and inputs the previously input phase signal 0 into the loop filter. The loop filter outputs the phase error saved in the first register module to the numerical controlled oscillator according to the previously input phase signal 0. The numerical controlled oscillator accumulates the phase error saved in the first register module and the phase error saved in the second register module of the numerical controlled oscillator, and inputs the accumulated value of the phase errors into the second phase signal selector. The phase signal generator generates, according to the indication of the second state signal and the initial phase signal saved in the phase signal generator, a phase signal satisfying a preset clock synchronization condition, and inputs the phase signal into the second phase signal selector. The second phase signal selector selects, according to the indication of the second state signal, the phase signal satisfying the preset clock synchronization condition and input by the phase signal generator as the phase selection signal of the CDR circuit. The terminal implements clock synchronization with the peer end according to the phase selection signal. In the embodiment of the present invention, after the terminal enters the REFRESH state from the QUIET state, the CDR circuit can implement clock synchronization with the peer end without waiting for the loop filter and the numerical controlled oscillator to be converged, but the phase signal generator generates the phase signal satisfying the preset clock synchronization condition, and the second phase signal selector selects the phase signal satisfying the preset clock synchronization condition as the phase selection signal of the CDR, so as to implement synchronization with the peer end rapidly, so that the terminal can receive the data transmitted by the peer end when entering the ACTIVE mode, thereby ensuring that the terminal implements an EEE function.

Persons skilled in the art may clearly understand that the present invention may be implemented by software plus a necessary universal hardware platform. Based on such understanding, the technical solutions in the embodiments of the present invention essentially, or the part contributing to the prior art may be implemented in the form of a software product. The computer software product is stored in a storage medium, such as ROM/RAM, magnetic disk, and optical disk, and includes several instructions for instructing a computer device (which may be a personal computer, a server, or a network device) to perform all or a part of steps of the methods described in the embodiments of the present invention.

Each embodiment in this specification is described in a progressive manner, reference may be made for the same or similar part of the embodiments, and focus of each embodiment is different from that of other embodiments. In particular, for a system embodiment, because it is basically similar to the method embodiments, the system embodiment is described simply, and the relevant part may be obtained with reference to the description of the method embodiments.

The foregoing description is merely about exemplary embodiments of the present invention, but is not intended to limit the protection scope of the present invention. Any modifications, equivalent substitutions, and improvements made within the idea and principle of the present invention shall fall within the protection scope of the present invention.

What is claimed is:

1. A clock data recovery (CDR) circuit, configured to perform clock synchronization in a terminal with an energy efficient Ethernet (EEE) function, and wherein the CDR circuit comprises: a phase detector, a first phase signal selector, a loop filter, a numerical controlled oscillator, a second phase signal selector, a phase signal generator, and a state machine; wherein:

the state machine is configured to generate a first state signal after receiving an indication based on a timer that the terminal has entered a REFRESH state from a QUIET state, and input the first state signal into the first phase signal selector, the phase signal generator, and the second phase signal selector;

the phase detector is configured to acquire a phase error between the terminal and a peer end from training data sent by the peer end, and input the phase error into the first phase signal selector;

the first phase signal selector is configured to select an input phase signal between a previously input phase signal 0 and the phase error input by the phase detector, and input the input phase signal into the loop filter, wherein the first phase signal selector selects the previously input phase signal 0 as the input phase signal based on receiving the first state signal from the state machine;

the loop filter is configured to output, according to the previously input phase signal 0, a first phase error saved in a first register module to the numerical controlled oscillator;

the numerical controlled oscillator is configured to accumulate the first phase error saved in the first register module and a second phase error saved in a second register module of the numerical controlled oscillator, and input an accumulated value of the first and second phase errors into the second phase signal selector;

the phase signal generator is configured to generate, according to the indication of the first state signal and an initial phase signal saved in the phase signal generator, a phase signal satisfying a preset clock synchronization condition, and input the phase signal into the second phase signal selector; and the second phase signal selector is configured to select, according to the indication of the first state signal, the phase signal satisfying the preset clock synchronization condition and input by the phase signal generator as a phase selection signal of the CDR circuit, wherein the phase selection signal is used to enable the terminal to implement the clock synchronization with the peer end according to the phase selection signal.

2. The CDR circuit according to claim 1, wherein the phase signal generator is configured to use the initial phase signal as the phase signal generated by the phase signal generator, and determine whether a signal-to-noise ratio of the terminal is smaller than a preset threshold according to the generated phase signal, if the signal-to-noise ratio is smaller than the preset threshold, determine that the initial phase signal satisfies the preset clock synchronization condition; if the signal-to-noise ratio is not smaller than the preset threshold, add a preset step value to the initial phase signal to produce the phase signal generated by the phase signal generator, and repeatedly perform the determining whether the signal-to-noise ratio of the terminal is smaller than the preset threshold according to the generated phase signal, until the phase signal satisfying the preset clock synchronization condition is generated.

3. The CDR circuit according to claim 1, wherein the state machine is further configured to generate a second state signal after receiving an indication that the terminal has entered the QUIET state, and input the second state signal into the first phase signal selector, the phase signal generator, and the second phase signal selector;

the phase detector is further configured to generate an invalid phase signal according to received invalid data, and input the invalid phase signal into the first phase signal selector;

the first phase signal selector is further configured to select the input phase signal between the previously input phase signal 0 and the invalid phase signal input by the phase detector, wherein the first phase signal selector selects the previously input phase signal 0 as the input phase signal based on receiving the second state signal from the state machine;

the loop filter is further configured to output, according to the previously input phase signal 0, the first phase error saved in the first register module to the numerical controlled oscillator;

the numerical controlled oscillator is further configured to accumulate the first phase error saved in the first register module and the second phase error saved in the second register module of the numerical controlled oscillator, and input the accumulated value of the first and second phase errors into the second phase signal selector;

the phase signal generator is further configured to input, according to the indication of the second state signal, a preset phase signal into the second phase signal selector; and the second phase signal selector is further configured to select, according to the indication of the second state signal, the accumulated value of the first and second phase errors input by the numerical controlled oscillator as the phase selection signal of the CDR circuit.

4. The CDR circuit according to claim 3, wherein the second phase signal selector is further configured to input the phase selection signal selected according to the indication of the second state signal into the phase signal generator; and the phase signal generator is further configured to save the phase selection signal as the initial phase signal of the phase signal generator.

5. The CDR circuit according to claim 1, wherein the second phase signal selector is further configured to input the phase selection signal selected according to the indication of the first state signal into the phase signal generator; and the phase signal generator is further configured to save the phase selection signal selected according to the indication of the first state signal.

6. The CDR circuit according to claim 5, wherein the state machine is further configured to generate a third state signal when receiving an indication indicative of generating the phase signal satisfying the preset clock synchronization condition, and input the third state signal into the first phase signal selector, the phase signal generator, and the second phase signal selector;

the first phase signal selector is further configured to select the input phase signal between the previously input phase signal 0 and the phase error input by the phase detector, wherein the first phase signal selector selects the phase error as the input phase signal based on receiving the third state signal from the state machine;

the loop filter is further configured to accumulate, within a preset convergence duration, the phase error input by the first phase signal selector and the first phase error saved in the first register module, save the accumulated value of the phase error input by the first phase signal selector and the first phase error into the first register module, and input the accumulated value of the phase error input by the first phase signal selector and the first phase error into the numerical controlled oscillator;

the numerical controlled oscillator is further configured to accumulate the phase error input by the loop filter and the second phase error saved in the second register module, and input the accumulated value of the phase error input by the loop filter and the second phase error into the second phase signal selector;

the phase signal generator is further configured to use, according to the indication of the third state signal, the saved phase selection signal selected according to the indication of the first state signal as the phase signal generated by the phase signal generator, and input the phase signal generated by the phase signal generator into the second phase signal selector; and the second phase signal selector is further configured to select, according to the indication of the third state signal, the phase signal input by the phase signal generator as the phase selection signal of the CDR circuit.

7. The CDR circuit according to claim 6, wherein the second phase signal selector is further configured to input the phase selection signal selected according to the indication of the third state signal into the phase signal generator; and the phase signal generator is further configured to save the phase selection signal selected according to the indication of the third state signal.

8. The CDR circuit according to claim 7, wherein the state machine is further configured to generate a fourth state signal after receiving an indication indicating that the convergence duration of the loop filter expires, and input the fourth state signal into the first phase signal selector, the phase signal generator, and the second phase signal selector;

the first phase signal selector is further configured to select the input phase signal between the previously input phase signal 0 and the phase error input by the phase detector, wherein the first phase signal selector selects the phase error as the input phase signal based on receiving the fourth state signal from the state machine;

the loop filter is further configured to accumulate the phase error input by the first phase signal selector and the first phase error saved in the first register module, save the accumulated value of the phase error input by the first phase signal selector and the first phase error into the first register module, and input the accumulated value of the phase error input by the first phase signal selector and the first phase error into the numerical controlled oscillator;

the numerical controlled oscillator is further configured to adjust a phase point for sampling local received data according to the accumulated value of the phase error input by the first phase signal selector and the first phase error, which is input by the loop filter, accumulate the phase error input by the loop filter and the second phase error saved in the second register module, and input the accumulated value of the phase error input by the loop filter and the second phase error into the second phase signal selector;

the phase signal generator is further configured to use, according to the indication of the fourth state signal, the saved phase selection signal selected according to the indication of the third state signal as the phase signal generated by the phase signal generator, and input the phase signal generated by the phase signal generator into the second phase signal selector; and the second phase signal selector is further configured to select, according to the indication of the fourth state signal, the accumulated value of the phase error input by the loop filter and the second phase error, which is input by the numerical controlled oscillator as the phase selection signal of the CDR circuit.

9. The CDR circuit according to claim 8, wherein
the second phase signal selector is further configured to input the phase selection signal selected according to the indication of the fourth state signal into the phase signal generator; and
the phase signal generator is further configured to save the phase selection signal selected according to the indication of the fourth state signal, wherein the phase selection signal is used as a preset phase signal of the phase signal generator when the terminal enters the QUIET state from the REFRESH state.

10. A terminal with an energy efficient Ethernet (EEE) function, comprising a clock data recovery (CDR) circuit and a control module;
wherein the CDR circuit is configured to perform clock synchronization in the terminal, and the CDR circuit comprises: a phase detector, a first phase signal selector, a loop filter, a numerical controlled oscillator, a second phase signal selector, a phase signal generator, and a state machine; wherein:
the state machine is configured to generate a first state signal after receiving an indication based on a timer that the terminal has entered a REFRESH state from a QUIET state, and input the first state signal into the first phase signal selector, the phase signal generator, and the second phase signal selector;
the phase detector is configured to acquire a phase error between the terminal and a peer end from training data sent by the peer end, and input the phase error into the first phase signal selector;
the first phase signal selector is configured to select an input phase signal between a previously input phase signal 0 and the phase error input by the phase detector, and input the input phase signal into the loop filter, wherein the first phase signal selector selects the previously input phase signal 0 as the input phase signal based on receiving the first state signal from the state machine;
the loop filter is configured to output, according to the previously input phase signal 0, a first phase error saved in a first register module to the numerical controlled oscillator;
the numerical controlled oscillator is configured to accumulate the first phase error saved in the first register module and a second phase error saved in a second register module of the numerical controlled oscillator, and input an accumulated value of the first and second phase errors into the second phase signal selector;
the phase signal generator is configured to generate, according to the indication of the first state signal and an initial phase signal saved in the phase signal generator, a phase signal satisfying a preset clock synchronization condition, and input the phase signal into the second phase signal selector; and
the second phase signal selector is configured to select, according to the indication of the first state signal, the phase signal satisfying the preset clock synchronization condition and input by the phase signal generator as a phase selection signal of the CDR circuit, wherein the phase selection signal is used to enable the terminal to implement the clock synchronization with the peer end according to the phase selection signal; and
the control module is configured to: after the CDR circuit implements the clock synchronization between the terminal and the peer end, and if the terminal has data to be transmitted, control the terminal to enter an ACTIVE mode; if the terminal has no data to be transmitted, control the terminal to enter the QUIET state after the REFRESH state is ended.

11. The terminal according to claim 10, wherein the phase signal generator is configured to use the initial phase signal as the phase signal generated by the phase signal generator, and determine whether a signal-to-noise ratio of the terminal is smaller than a preset threshold according to the generated phase signal, if the signal-to-noise ratio is smaller than the preset threshold, determine that the initial phase signal satisfies the preset clock synchronization condition; if the signal-to-noise ratio is not smaller than the preset threshold, add a preset step value to the initial phase signal to produce the phase signal generated by the phase signal generator, and repeatedly perform the determining whether the signal-to-noise ratio of the terminal is smaller than the preset threshold according to the generated phase signal, until the phase signal satisfying the preset clock synchronization condition is generated.

12. The terminal according to claim 10, wherein
the state machine is further configured to generate a second state signal after receiving an indication indicating that the terminal has entered the QUIET state, and input the second state signal into the first phase signal selector, the phase signal generator, and the second phase signal selector;
the phase detector is further configured to generate an invalid phase signal according to received invalid data, and input the invalid phase signal into the first phase signal selector;
the first phase signal selector is further configured to select the input phase signal between the previously input phase signal 0 and the invalid phase signal input by the phase detector, wherein the first phase signal selector selects the previously input phase signal 0 as the input phase signal based on receiving the second state signal from the state machine;
the loop filter is further configured to output, according to the previously input phase signal 0, the first phase error saved in the first register module to the numerical controlled oscillator;
the numerical controlled oscillator is further configured to accumulate the first phase error saved in the first register module and the second phase error saved in the second register module of the numerical controlled oscillator, and input the accumulated value of the first and second phase errors into the second phase signal selector;
the phase signal generator is further configured to input, according to the indication of the second state signal, a preset phase signal into the second phase signal selector; and
the second phase signal selector is further configured to select, according to the indication of the second state signal, the accumulated value of the first and second phase errors input by the numerical controlled oscillator as the phase selection signal of the CDR circuit.

13. The terminal according to claim 12, wherein
the second phase signal selector is further configured to input the phase selection signal selected according to the indication of the second state signal into the phase signal generator; and
the phase signal generator is further configured to save the phase selection signal as the initial phase signal of the phase signal generator.

14. The terminal according to claim 10, wherein
the second phase signal selector is further configured to input the phase selection signal selected according to the indication of the first state signal into the phase signal generator; and
the phase signal generator is further configured to save the phase selection signal selected according to the indication of the first state signal.

15. The terminal according to claim 14, wherein
the state machine is further configured to generate a third state signal when receiving an indication indicative of generating the phase signal satisfying the preset clock synchronization condition, and input the third state signal into the first phase signal selector, the phase signal generator, and the second phase signal selector;
the first phase signal selector is further configured to select the input phase signal between the previously input phase signal 0 and the phase error input by the phase detector, wherein the first phase signal selector selects the phase error as the input phase signal based on receiving the third state signal from the state machine;
the loop filter is further configured to accumulate, within a preset convergence duration, the phase error input by the first phase signal selector and the first phase error saved in the first register module, save the accumulated value of the phase error input by the first phase signal selector and the first phase error into the first register module, and input the accumulated value of the phase error input by the first phase signal selector and the first phase error into the numerical controlled oscillator;
the numerical controlled oscillator is further configured to accumulate the phase error input by the loop filter and the second phase error saved in the second register module, and input the accumulated value of the phase error input by the loop filter and the second phase error into the second phase signal selector;
the phase signal generator is further configured to use, according to the indication of the third state signal, the saved phase selection signal selected according to the indication of the first state signal as the phase signal generated by the phase signal generator, and input the phase signal generated by the phase signal generator into the second phase signal selector; and
the second phase signal selector is further configured to select, according to the indication of the third state signal, the phase signal input by the phase signal generator as the phase selection signal of the CDR circuit.

16. The terminal according to claim 15, wherein
the second phase signal selector is further configured to input the phase selection signal selected according to the indication of the third state signal into the phase signal generator; and
the phase signal generator is further configured to save the phase selection signal selected according to the indication of the third state signal.

17. The terminal according to claim 16, wherein
the state machine is further configured to generate a fourth state signal after receiving an indication indicating that the convergence duration of the loop filter expires, and input the fourth state signal into the first phase signal selector, the phase signal generator, and the second phase signal selector;
the first phase signal selector is further configured to select the input phase signal between the previously input phase signal 0 and the phase error input by the phase detector, wherein the first phase signal selector selects the phase error as the input phase signal based on receiving the fourth state signal from the state machine;
the loop filter is further configured to accumulate the phase error input by the first phase signal selector and the first phase error saved in the first register module, save the accumulated value of the phase error input by the first phase signal selector and the first phase error into the first register module, and input the accumulated value of the phase error input by the first phase signal selector and the first phase error into the numerical controlled oscillator;
the numerical controlled oscillator is further configured to adjust a phase point for sampling local received data according to the accumulated value of the phase error input by the first phase signal selector and the first phase error, which is input by the loop filter, accumulate the phase error input by the loop filter and the second phase error saved in the second register module, and input the accumulated value of the phase error input by the loop filter and the second phase error into the second phase signal selector;
the phase signal generator is further configured to use, according to the indication of the fourth state signal, the saved phase selection signal selected according to the indication of the third state signal as the phase signal generated by the phase signal generator, and input the phase signal generated by the phase signal generator into the second phase signal selector; and
the second phase signal selector is further configured to select, according to the indication of the fourth state signal, the accumulated value of the phase error input by the loop filter and the second phase error, which is input by the numerical controlled oscillator as the phase selection signal of the CDR circuit.

18. The terminal according to claim 17, wherein
the second phase signal selector is further configured to input the phase selection signal selected according to the indication of the fourth state signal into the phase signal generator; and
the phase signal generator is further configured to save the phase selection signal selected according to the indication of the fourth state signal, wherein the phase selection signal is used as a preset phase signal of the phase signal generator when the terminal enters the QUIET state from the REFRESH state.

19. A method for performing clock synchronization in a terminal with an energy efficient Ethernet (EEE) function, comprising:
producing an indication indicating that the terminal has entered a REFRESH state from a QUIET state;
generating a first state signal in response to the indication;
acquiring a phase error between the terminal and a peer end from training data sent by the peer end;
selecting between a previously input phase signal 0 and the phase error between the terminal and the peer end, wherein the selecting selects the previously input phase signal 0 based on the first state signal generated in response to the indication;
outputting a first phase error saved in a first register according to selection of the previously input phase signal 0;
accumulating the first phase error saved in the first register and a second phase error saved in a second register to generate an accumulated value of the first and second phase errors;
generating a phase signal satisfying a preset clock synchronization condition according to the indication of the first state signal and an initial phase signal; and selecting according to the indication of the first state signal, the phase signal satisfying the preset clock synchronization condition as a phase selection signal to enable the terminal to implement the clock synchronization with the peer end.

20. The method according to claim 19, wherein generating the phase signal satisfying the preset clock synchronization condition further comprises:
    determining whether a signal-to-noise ratio of the terminal is smaller than a preset threshold;
    determining that the initial phase signal satisfies the preset clock synchronization condition if the signal-to-noise ratio is smaller than the preset threshold, and outputting the initial phase signal as the phase signal satisfying the preset clock synchronization condition; and
    adding a preset step value to the initial phase signal to produce a phase signal adding result if the signal-to-noise ratio is not smaller than the preset threshold, and repeatedly perform the determining whether the signal-to-noise ratio of the terminal is smaller than the preset threshold, until the phase signal adding result satisfies the preset clock synchronization condition, and outputting the phase signal adding result as the phase signal satisfying the preset clock synchronization condition.

* * * * *

UNITED STATES PATENT AND TRADEMARK OFFICE
CERTIFICATE OF CORRECTION

| | | |
|---|---|---|
| PATENT NO. | : 8,885,785 B2 | Page 1 of 1 |
| APPLICATION NO. | : 14/013895 | |
| DATED | : November 11, 2014 | |
| INVENTOR(S) | : Zhang et al. | |

It is certified that error appears in the above-identified patent and that said Letters Patent is hereby corrected as shown below:

On the Title Page item (71)

*Under the Applicant:*

Huawei Technologies Co., Ltd., Guangdong (CN)

should read

Huawei Technologies Co., Ltd., Shenzhen (CN)

Signed and Sealed this
Second Day of June, 2015

Michelle K. Lee
*Director of the United States Patent and Trademark Office*